United States Patent [19]

Green et al.

[11] Patent Number: 5,466,943
[45] Date of Patent: Nov. 14, 1995

[54] EVACUATED TESTING DEVICE HAVING CALIBRATED INFRARED SOURCE

[75] Inventors: Paul D. Green, Redondo Beach; Stefan T. Baur, Rancho Palos Verdes, both of Calif.

[73] Assignee: Hughes Aircraft Company, Los Angeles, Calif.

[21] Appl. No.: 123,021

[22] Filed: Sep. 16, 1993

[51] Int. Cl.[6] ................................ G21G 4/00; G01J 5/00
[52] U.S. Cl. ...................................... 250/493.1; 250/338.1
[58] Field of Search .......................... 250/493.1, 504 R, 250/338.1

[56] References Cited

U.S. PATENT DOCUMENTS

| | | | |
|---|---|---|---|
| 3,786,269 | 1/1974 | Cooper | 250/334 |
| 3,813,552 | 5/1974 | Johnson | 250/353 |
| 4,004,148 | 1/1977 | Howard | 62/349 |
| 4,317,042 | 2/1982 | Bartell | 62/493.1 |
| 4,862,002 | 8/1989 | Wang et al. | 62/332 |
| 4,922,116 | 5/1990 | Grinberg | 250/493.1 |
| 5,103,097 | 4/1992 | Montanari | 62/352 |
| 5,197,295 | 3/1993 | Pundak | 62/6 |

Primary Examiner—Bruce C. Anderson
Attorney, Agent, or Firm—W. C. Schubert; W. K. Denson-Low

[57] ABSTRACT

An evacuated testing device (100) including a housing (106) providing a test chamber (101) therein, a first mechanism (102) for retaining an object (116) under test in relation to an aperture (112), a second mechanism (104) positioned within the test chamber (101) for generating and transmitting uniform electromagnetic radiation to the object (116), and a third mechanism (122) disposed within the test chamber (101) in thermal communication with the second mechanism (104) for varying the temperature thereof. In a preferred embodiment, a test dewar (102) and an infrared blackbody radiating source (104) are enclosed within a test chamber (101) of the evacuated testing device (100). A focal plane array (116) is mounted on a cold finger (114) within the test dewar (102) in close proximity to an emissive surface (126) of the blackbody radiating source (104). A thermoelectric cooler (122) varies the temperature of the emissive surface (126) which generates and transmits the infrared radiation. An aperture (112) formed within a cold shield (110) and the temperature of the blackbody radiating source (104) determine the amount of radiation impinging upon the focal plane array (116). The blackbody radiating source (104) simulates typical terrestrial background radiation levels over a temperature range of from −40° C. to +80° C., is controlled and calibrated to within 0.05° C. and can be slewed between different temperatures in a brief period.

18 Claims, 1 Drawing Sheet

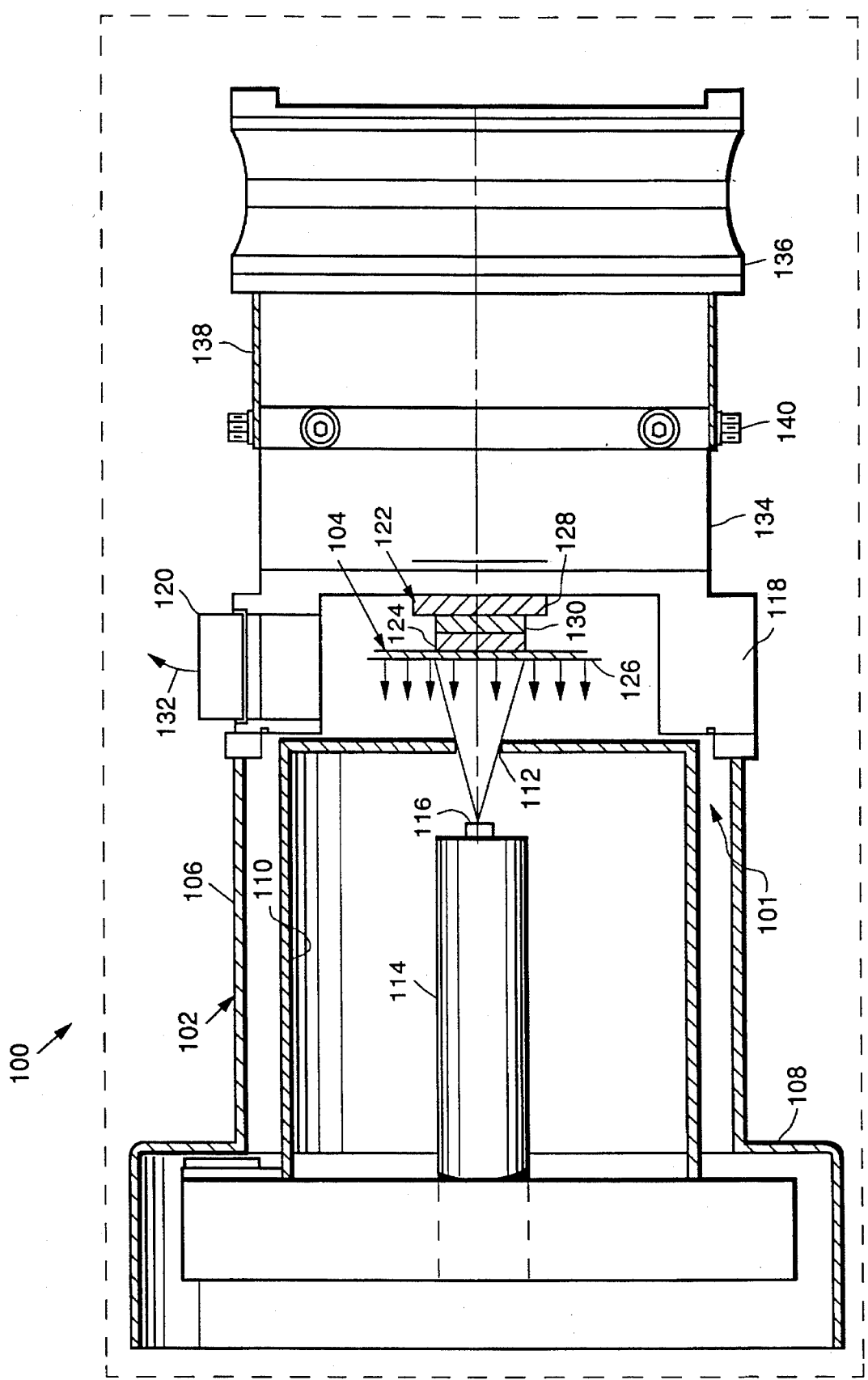

EVACUATED TESTING DEVICE HAVING CALIBRATED INFRARED SOURCE

BACKGROUND OF THE INVENTION

1. Field of the Invention

The present invention relates to electro-optical testing. More specifically, the present invention relates to methods and apparatus for evaluating focal plane arrays using an infrared blackbody source.

While the present invention is described herein with reference to illustrative embodiments for particular applications, it should be understood that the invention is not limited thereto. Those having ordinary skill in the art and access to the teachings provided herein will recognize additional modifications, applications and embodiments within the scope thereof and additional fields in which the present invention would be of significant utility.

2. Description of the Related Art

A focal plane array senses infrared (IR) radiation and converts the received IR radiation to electrical signals. The electrical signals are processed and transmitted to another subsystem where the information is utilized. As the focal plane array will be utilized in diverse ambient temperature emvironments, the focal plane array should be tested and evaluated over the temperature range of interest.

The evaluation of a focal plane array requires a uniform blackbody source of IR radiation. A blackbody is a uniform emitter of radiation generally used to test and evaluate an IR device such as a focal plane array. Typically, a dewar is employed during the process. A dewar is an evacuated chamber void of atmospheric gases which is commonly used in cryogenic testing of semi-conductor devices such as a focal plane array. Previously, the dewar typically housed the focal plane array under test and cooperated with a blackbody radiation source external to the dewar. The IR radiation emitted from the blackbody source was then transmitted to the focal plane array within the dewar through an IR transmissive window comprised of, for example, sapphire.

To accurately characterize the performance of a focal plane array, the IR blackbody source should simulate typical terrestrial background radiation levels. The typical terrestrial background radiation levels span the range of from −40° C. to +80° C. Thus, the blackbody source should serve as a heat generator and provide varying intensity levels of photons that simulate the various terrestrial conditions in the laboratory. The various terrestrial conditions include the ambient air and ground temperatures of the surrounding environment.

Unfortunately, an IR blackbody source capable of simulating the temperature range of interest (e.g., from −40° C. to +80° C.) is not available. As a result, the focal plane array cannot be accurately characterized under all expected operating conditions without significantly reconfiguring the test dewar. In order to reconfigure the test dewar, the testing of the focal plane array must be terminated and the dewar must be opened to permit component parts to be modified. Thereafter, the testing must be reinitiated with a new set of variables. Thus, reconfiguring the test dewar is time consuming and labor intensive.

More recently developed IR blackbody sources are capable of simulating wider temperature ranges (e.g., −15° C. to +50° C.). However, operation of these sources results in atmospheric condensation (frost) at 0° C. and below and other atmospheric effects such as air currents. These conditions substantially inhibit control of the uniformity of the IR blackbody source and thus, the test results are often inaccurate.

It is also important that the IR blackbody source be uniform in order to maintain the relationship between the blackbody source and the focal plane array. The blackbody source must be controlled and calibrated over the entire temperature range of interest to receive valid test results. However, conventional blackbody sources generally generate and transmit non-uniform levels of IR radiation.

Thus, there is a need in the art for improvements in evacuated chambers for testing semi-conductor devices to simulate typical terrestrial background radiation levels, position the blackbody radiation source proximate to the test dewar, and eliminate derogatory effects on the test results due to the atmosphere.

SUMMARY OF THE INVENTION

The need in the art is addressed by the evacuated testing device having calibrated infrared source of the present invention. The invention includes a housing providing a test chamber therein, a first mechanism for retaining an object under test in relation to an aperture, a second mechanism positioned within the test chamber for generating and transmitting uniform electromagnetic radiation to the object, and a third mechanism disposed within the test chamber in thermal communication with the second mechanism for varying the temperature thereof.

In a preferred embodiment, a test dewar and an infrared blackbody radiating source are enclosed within a test chamber of the evacuated testing device. A focal plane array is mounted on a cold finger within the test dewar in close proximity to an emissive surface of the blackbody radiating source. A thermoelectric cooler varies the temperature of the emissive surface which generates and transmits the infrared radiation. An aperture formed within a cold shield and the temperature of the blackbody radiating source determine the amount of radiation impinging upon the focal plane array. The blackbody radiating source simulates typical terrestrial background radiation levels over a temperature range of from −40° C. to +80° C., is controlled and calibrated to within 0.05° C. and can be slewed between different temperatures in a brief period.

BRIEF DESCRIPTION OF THE DRAWINGS

The FIGURE is a cross-sectional view of the evacuated testing device having calibrated infrared source of the present invention showing a test dewar and an infrared blackbody radiation source.

DESCRIPTION OF THE INVENTION

The invention is an evacuated testing device 100 utilizing infrared (IR) radiation for testing semi-conductor devices as shown in the FIGURE. The evacuated testing device 100 provides a test chamber 101 which includes a test dewar 102 and an infrared (IR) blackbody radiating source 104. The test dewar 102 includes an outer structure 106 and a base 108 each of which can be comprised of aluminum. The base 108 serves as part of the support structure of the test dewar 102 as shown in the FIGURE. The entire test chamber 101 is under vacuum.

Positioned within the test dewar 102 and attached to the base 108 is a cold shield 110. An aperture 112 is formed within the cold shield 110 for admitting the IR radiation from the IR blackbody radiating source 104. Mounted to the dewar base 108 and extending into the test chamber 101 is a cold finger 114. The cold finger 114 provides a platform for mounting a semiconductor device under test such as a focal plane array 116. The cold finger 114, which is connected to a refrigerated system (not shown), also cools the focal plane array 116 by drawing heat therefrom during cryogenic testing.

The focal plane array 116 is an infrared sensing device that senses uniform IR radiation emitted from, for example, the IR blackbody source 104. The focal plane array 116 can be comprised of a detector and associated signal processing equipment (not shown). The detector serves to sense the photon radiation from the blackbody source 104 and converts the photons into electrical signals. The electrical signals are then processed by the signal processing equipment (not shown) associated with the focal plane array 116 which provides an output signal. The output signal is then transmitted to, for example, a computer system for subsequent processing. The size of the aperture 112 formed within the cold shield 110 and the temperature of the IR blackbody source 104 determines the amount of radiation impinging upon the focal plane array 116. The cold shield 110 can also be comprised of aluminum. The test dewar 102 thus incorporates the cold shield 110, the aperture 112, the cold finger 114 and the focal plane array 116.

Butted against and hermetically sealed to the test dewar 102 is a housing 118 for the IR blackbody radiating source 104 as shown in the FIGURE. The blackbody housing 118 can be comprised of aluminum and the hermetic seal between the test dewar 102 and the housing 118 is established and maintained by methods known in the art. A hermetically sealed feedthru connector 120 passes through the blackbody housing 118. The feedthru connector 120 is utilized to route electrical cabling between a control box (not shown) located external to the test chamber 101 and the IR blackbody radiating source 104.

The IR blackbody radiating source 104 is a uniform radiometric source exhibiting extremely low reflectivity and is an efficient emitter of IR radiation. The radiating source 104 is generally employed for testing and evaluating IR sensitive devices such as the focal plane array 116 shown in the FIGURE. The radiating source 104, which replaces the vacuum shroud of prior art test dewars, includes a two-stage thermoelectric cooler 122, an IR sensor 124 and an emissive surface 126. The thermoelectric cooler 122 comprises two ceramic plates 128 and 130 as shown in FIG. 1. The ceramic plates 128 and 130 include a plurality of semiconductors positioned therein as is known in the art. The ceramic plates 128 and 130 are electrically connected to a direct current voltage source (not shown) via a plurality of conductors 132 routed through the feedthru connector 120.

By applying different D.C. voltages to the ceramic plates 128 and 130, the thermoelectric cooler 122 can act as a hot plate or a cold plate. For example, when a D.C. voltage is applied to the ceramic plates 128 and 130 that results in positive current flow, the thermoelectric cooler 122 functions as a hot plate. Likewise, when a D.C. voltage is applied to the ceramic plates 128 and 130 that results in negative current flow, the thermoelectric cooler 122 functions as a cold plate. Thus, the thermoelectric cooler 122 operates as a heat pump to vary the temperature of the emissive surface 126 shown in the FIGURE. The emissive surface 126 thermally communicates with the thermoelectric cooler 122 and functions as the blackbody radiator. The emissive surface 126 is fabricated from copper and is coated with a painted surface as is known in the art. The temperature of the emissive surface 126 is logarithmically proportional to the IR radiation generated and emitted by the surface. By varying the voltage applied to the thermoelectric cooler 122, the temperature of the emissive surface 126 is changed. By varying the temperature of the emissive surface 126, the amount of IR radiation generated and transmitted is also varied.

Positioned between the thermoelectric cooler 122 and the emissive surface 126 is the IR sensor 124. In particular, the IR sensor 124 is mounted to the backside of the emissive surface 126 and can be a commercially available thermistor. The thermistor is a calibrated resistor used to measure the differences in temperature between two surfaces. Electrical energy is delivered to the sensor 124 via the plurality of conductors 132 routed through the feedthru connector 120 as shown in the FIGURE. The sensor 124 on the IR blackbody radiating source 104 functions to provide feedback signals to the control box (not shown) necessary to maintain a specific temperature by the thermoelectric cooler 122 and thus the emissive surface 126.

Attached to the blackbody housing 118 is a heat sink 134 as shown in the FIGURE. The heat sink 134 serves to cool the hot side of the thermoelectric cooler 122 which pumps heat into and out of the IR blackbody radiating source 104. Excess heat or cooling is removed from the structure of the thermoelectric cooler 122 via the heat sink 134 which can be, for example, a finned metallic extrusion. A cooling fan 136 is employed to draw air over the heat sink 134 to assist in removing the excess heat or cooling. The cooling fan 136 is connected to the heat sink 134 and thus the blackbody housing 118 via a shroud 138 at a mechanical interface 140.

The evacuated testing device 100 of the present invention comprises a thermoelectrically temperature stabilized blackbody radiating source 104 for use within an evacuated environment of the test chamber 101 for testing semiconductor devices. The radiating source 104 is a uniform radiometric source capable of maintaining to within 0.05° C. any temperature between −40° C. to +80° C. This extended temperature range is very useful in testing a focal plane array 116. Because the blackbody radiating source 104 is mounted within an evacuated environment, performance is not adversely affected by air currents or moisture condensing on the surface of the source 104. Further, since the blackbody radiating source 104 is mounted within the test chamber 101, there are no intervening optical elements between the source 104 and the focal plane array 116 under test. Thus, any window for viewing the IR radiating source 104 is eliminated.

Finally, the IR blackbody radiating source 104 can be slewed between temperatures within the test range (e.g., −40° C. to +80° C.) in a short time period. This is true because the evacuated environment (e.g., approximately $10^{-4}$ torr) eliminates any interference and degradation due to the atmosphere and extends the range of the blackbody radiating source 104. The slewing and temperature control of the blackbody radiating source 104 ensure rapid increment stepping across the test temperature range of interest. Thus, with the proper control, the blackbody source 104 can be automatically ramped. Therefore, the focal plane array 116 can be accurately characterized over all radiometric backgrounds of interest within the test chamber 101 without significant reconfiguration of the testing device 100.

The evacuated testing device 100 of the present invention simplifies the task of testing a focal plane array 116. It enables the simulation of very high background flux conditions and extremely low background flux conditions within a few minutes. A very high background flux condition is generated by a highly emissive photon source having a temperature of greater than +80° C. while an extremely low background flux condition is generated by a highly emissive photon source with a temperature less than −40° C. The invention exhibits a unique design in that the IR blackbody radiating source 104 and the test dewar 102 incorporating the focal plane array 116 are each contained within the test chamber 101 of the evacuated testing device 100. Further, the present invention can be computer controlled and enhances the ability to determine the operating characteristics of the focal plane array 116 over a large scene dynamic range.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such modifications, applications and embodiments within the scope of the present invention.

Accordingly,

What is claimed is:

1. A device for testing an object comprising:

a housing providing a test chamber therein;

first means for retaining said object within said test chamber;

second means positioned within said test chamber for generating and transmitting uniform electromagnetic radiation to said object; and third means disposed within said test chamber in thermal communication with said second means for varying the temperature thereof.

2. The testing device of claim 1 wherein said first means is a test dewar under vacuum.

3. The testing device of claim 1 wherein said object under test is a focal plane array.

4. The testing device of claim 1 further including a platform for retaining said object within said first means.

5. The testing device of claim 4 wherein said platform is a cold finger.

6. The testing device of claim 1 wherein said second means comprises a uniform infrared radiating source.

7. The testing device of claim 6 wherein said uniform infrared radiating source is fashioned from copper and includes a painted surface.

8. The testing device of claim 1 wherein said third means comprises a thermoelectric cooler.

9. The testing device of claim 8 wherein said thermoelectric-cooler is a two stage thermoelectric cooler.

10. The testing device of claim 1 wherein said first means further includes a radiation shield having an aperture formed therein for admitting said uniform electromagnetic radiation.

11. The testing device of claim 10 wherein said radiation shield is comprised of aluminum.

12. The testing device of claim 1 further including a blackbody housing for enclosing said second means.

13. The testing device of claim 1 further including a heat sink for cooling said third means.

14. The testing device of claim 13 further including a cooling fan for cooling said heat sink.

15. The testing device of claim 14 further including a shroud for enclosing said cooling fan.

16. The testing device of claim 1 further including a hermetically sealed connector for providing access to said second means.

17. The testing device of claim 1 wherein said second means simulates typical terrestrial background radiation levels over a temperature range of from −40° C. to +80° C.

18. A device for testing an object comprising:

a housing providing a test chamber therein;

an evacuated test dewar for retaining said object within said test chamber;

a uniform infrared radiating source positioned within said test chamber for generating and transmitting uniform electromagnetic radiation to said object; and a thermoelectric cooler disposed within said test chamber in thermal communication with said radiating source for varying the temperature thereof.

* * * * *